United States Patent
Schell et al.

(10) Patent No.: US 8,836,549 B2
(45) Date of Patent: Sep. 16, 2014

(54) USE OF LOGIC CIRCUIT EMBEDDED INTO COMPARATOR FOR FOREGROUND OFFSET CANCELLATION

(75) Inventors: Robert Schell, Chatham, NJ (US); Michael R. Elliott, Summerfield, NC (US)

(73) Assignee: Analog Devices, Inc., Norwood, MA (US)

( * ) Notice: Subject to any disclaimer, the term of this patent is extended or adjusted under 35 U.S.C. 154(b) by 50 days.

(21) Appl. No.: 13/330,939

(22) Filed: Dec. 20, 2011

(65) Prior Publication Data

US 2013/0154860 A1 Jun. 20, 2013

(51) Int. Cl.
*H03M 1/06* (2006.01)

(52) U.S. Cl.
USPC ........... 341/118; 341/120; 341/155; 341/161; 341/162; 341/163

(58) Field of Classification Search
CPC ............ H03M 1/1009; H03M 1/1023; H03M 1/1047; H03M 1/1052; H03M 1/1057; H03M 1/1061; H03M 1/36; H03M 1/361; H03M 1/38; H03M 1/42
USPC .......................... 341/118, 120, 155, 161–163
See application file for complete search history.

(56) References Cited

U.S. PATENT DOCUMENTS

| | | | | |
|---|---|---|---|---|
| 6,384,757 B1* | 5/2002 | Kosonen | ........................ | 341/120 |
| 6,433,712 B1* | 8/2002 | Ohnhaeuser et al. | ......... | 341/118 |
| 6,911,858 B2* | 6/2005 | Mori | ............................. | 327/307 |
| 7,075,465 B2* | 7/2006 | Jonsson et al. | ................ | 341/120 |
| 7,362,246 B2* | 4/2008 | Park et al. | ..................... | 341/118 |
| 7,589,650 B2* | 9/2009 | Hsien et al. | .................. | 341/118 |
| 7,646,324 B2* | 1/2010 | Matsubayashi | ............... | 341/161 |
| 8,416,105 B2* | 4/2013 | Lai et al. | ....................... | 341/120 |
| 8,638,248 B2* | 1/2014 | Wu et al. | ...................... | 341/118 |
| 2010/0164770 A1* | 7/2010 | Wan et al. | .................... | 341/133 |

* cited by examiner

*Primary Examiner* — Khai M Nguyen
(74) *Attorney, Agent, or Firm* — Kenyon & Kenyon, LLP

(57) ABSTRACT

A system and method are described herein that provide for the calibration of the offset of a comparator on a per-comparator basis. An injection is made to the comparator at determined injection points using a low-power DAC, to calibrate the offset of the comparator. The DAC can be selectively controlled by a digital codeword that is generated based on an output of the comparator and the comparator's offset. Further embodiments of the invention present a system and method for calibrating the offset of a comparator of a flash ADC in each stage of a pipeline ADC. The system and method may provide for the calibration in a manner without affecting the speed of the pipeline ADC or adding significant power to the pipeline ADC.

22 Claims, 1 Drawing Sheet

USE OF LOGIC CIRCUIT EMBEDDED INTO COMPARATOR FOR FOREGROUND OFFSET CANCELLATION

FIELD OF THE INVENTION

The present invention relates to a process for calibrating an offset of a comparator on a per-comparator basis. The present invention further relates to circuit architecture designed to remove the offset of a comparator. The present invention further relates to a process for using logic embedded in a comparator to calibrate the offset of the comparator. The present invention further relates to a process for calibrating an offset of a comparator in a stage of a pipeline analog to digital converter.

BACKGROUND INFORMATION

A comparator is used to compare two signals at its input terminals, and selectively controls its output to indicate which of the two input signals is larger. As comparators are not ideal circuit elements, every comparator will have an offset voltage. This offset voltage may be on the order of a few millivolts, but the presence of the offset of the comparator may distort the output of the device.

Comparators may be often used, for example, in a configuration of an analog to digital converter. An analog to digital converter ("ADC") is used to convert an analog signal into a digital representation of the analog signal. The ADC typically samples the analog signal at periodic intervals and generates a digital value for each sample indicating the approximate magnitude of the sampled analog signal. One type of ADC uses a technique known as successive approximation recursively ("SAR") to convert each analog input sample to a digital value. Another type of ADC is called a pipeline ADC. These converters typically include a plurality of stages, each of the stages having a digital to analog converter ("DAC") and a flash ADC having many comparators to produce a digital value representing the magnitude of the analog input sample.

A limited offset may be acceptable for the comparator in the flash ADC of the pipeline ADC, but a pipeline ADC without a SHA will have an offset beyond the bounds of acceptability. An allocation can be made for the sampling bandwidth mismatch, but any offset of the comparator in the flash ADC if finite and may take up part of the allocation for the sampling bandwidth mismatch. Therefore, it is preferable to minimize the comparator offset and to distribute the majority of the allocation for the sampling bandwidth mismatch to the actual sample mismatch. This becomes problematic, because the comparator offset is not readily or easily removed in existing systems.

Previous efforts to address comparator offset have primarily focused on the implementation of analog elements to cancel any offset. However, these efforts have generally focused on the use of a high-gain preamplifier, which may add additional area to the integrated circuit and distort the overall gain of the circuit. Other efforts to address comparator offset have focused on using capacitors within comparator latch nodes to store and cancel the comparator offset. This is problematic, as it requires that the included capacitors touch the latch nodes which leads to the presence of parasitic capacitance in the converter. This parasitic capacitance is undesirable because it may slow down any converter in which the comparator is implemented.

Thus there remains a need in the art, for a system and method which allows for the correction of an offset in a general comparator on a per-comparator basis. There also remains a need in the art, for a system and method which allows for the removal of an offset for a comparator in the flash ADC of a pipeline ADC. There also remains a need in the art, for a system and method which allows for the calibration of the offset of a comparator in the flash ADC of a pipeline ADC in an efficient and controllable manner, particularly without affecting the converter speed or adding significant power to the pipeline ADC.

SUMMARY OF THE INVENTION

A system and method are described herein that provide for the calibration of the offset of a comparator on a per-comparator basis. An injection is made to the comparator at determined injection points using a low-power DAC, to calibrate the offset of the comparator. The DAC can be selectively controlled by a digital codeword that is locally generated based on an output of the comparator and the comparator's offset. Further embodiments of the invention present a system and method for calibrating the offset of a comparator of a flash ADC in each stage of a pipeline ADC. The system and method may provide for the calibration in such a manner without affecting the speed of the pipeline ADC or adding significant power to the pipeline ADC.

In particular, the exemplary embodiments and/or exemplary methods of the present invention are directed to a system and method for cancelling an offset of a comparator. The system includes a comparator whose input terminals to the comparator are both switched to a reference signal, a logic circuit that receives an output from the comparator and generates a digital codeword, and a digital to analog converter that receives that digital codeword and injects a calibration current or voltage or voltage at designated injection points in the comparator to cancel the offset.

In the system and method, the logic circuit and the DAC are implemented locally with the comparator, with the logic circuit configured to store the generated digital codeword. The logic circuit can be further configured to be controlled by a calibration signal. The logic circuit can be designed to be SAR logic. In the system and method, the comparator may be implemented in an analog to digital converter. In some implementations, the comparator is implemented in a flash analog to digital converter. In these implementations, the flash ADC may be incorporated in a stage of a pipeline ADC.

In the system and method, input terminals to the comparator are switched to the reference signal when input switches are overridden to not switch between an input signal and the reference signal. The input terminals to the comparator are switched to the reference signal when the calibration signal goes high.

The exemplary embodiments and/or exemplary methods of the present invention are also directed to a method for cancelling an offset of a comparator. This method includes switching input terminals to the comparator to a reference signal and receiving an output from the comparator by a logic circuit. A digital codeword is also generated by the logic circuit and stored in the logic circuit. The logic circuit may then transmit the digital codeword to a digital to analog converter, where the DAC injects a calibration current or voltage or voltage into the comparator at designated injection points to cancel the offset.

DETAILED DESCRIPTION

The subject invention will now be described in detail for specific preferred embodiments of the invention, it being understood that these embodiments are intended only as illustrative examples and the invention is not to be limited thereto.

Failure to remove the offset for a comparator can distort the performance of the comparator. For example, in configurations where a comparator is in a flash ADC of each of the stages in a pipeline ADC, the presence of an offset in each comparator leads to an allotment of an allocation for sampling bandwidth mismatches in the pipeline ADC towards comparator offset. In such a configuration, the comparator offset is difficult to remove without adversely affecting the speed and total power of the pipeline ADC. Exemplary embodiments of the present invention provide a system and method that allows for the calibration of the offset of a comparator on a per-comparator basis. An injection is made to the comparator at a determined injection point using a low-power DAC, to calibrate the offset of the comparator. The DAC can be selectively controlled by a digital codeword that is generated based on an output of the comparator and the comparator's offset. Further embodiments of the present invention provide a system and method for calibrating the offset of a comparator of a flash ADC in each stage of a pipeline ADC. The system and method may provide for the calibration in a manner without affecting the speed of the pipeline ADC or adding significant power to the pipeline ADC.

Figure 1:
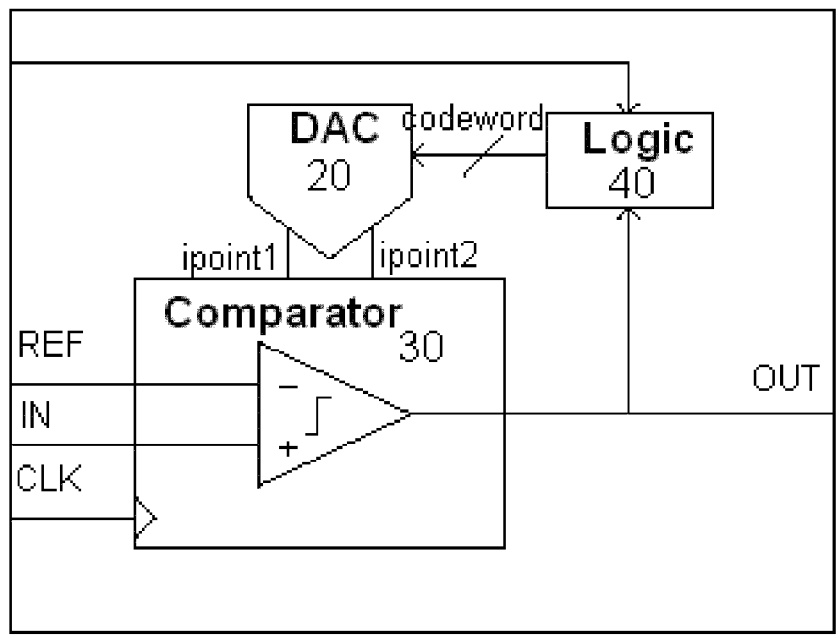
FIG. 1 is a diagram of a system having a DAC injecting a calibration current or voltage or voltage to a comparator according to an example embodiment of the present invention.

FIG. 1 illustrates a system having a DAC injecting a calibration current or voltage or voltage to a comparator according to an embodiment of the present invention. The system illustrated in FIG. 1, may include a comparator 30. In an embodiment, comparator 30 may be a stand alone comparator in an integrated circuit. In another embodiment, comparator 30 may be implemented in an ADC. In an example embodiment, comparator may be implemented in a flash ADC of a pipeline ADC. In an alternate embodiment, comparator 30 may be implemented in a successive approximation converter or a sigma delta converter.

Comparator 30 may be connected to logic circuit 40 and DAC 20. Comparator 30 may receive an input signal, Vin, at one of the terminals of the comparator. Comparator 30 may be connected to the input signal through a pair of switches. When the pair of connecting switches is closed, comparator 30 may be connected to the input signal. When the pair of connecting switches is opened, comparator 30 may be isolated from the input signal.

Comparator 30 may also receive a reference signal, Vref, at the other terminal of the comparator. In the embodiment of FIG. 1, comparator 30 may receive Vin at the non-inverting terminal and Vref at the inverting terminal, but this orientation may be reversed in other embodiments. Comparator 30 may be connected to the reference signal through a plurality of switches. When the plurality of connecting switches is closed, comparator 30 may be connected to the reference signal. When the plurality of connecting switches is opened, comparator 30 may be isolated from the reference signal. Comparator 30 may operate at a clock speed as determined by a designer. During a sampling phase, where switches to the input signal and to the reference signal are closed and the comparator 30 is connected at the inverting terminal to the reference signal and at the non-inverting terminal to the input signal, the reference signal may be compared to the input signal. During this operation, comparator 30 may have a resulting offset.

The system illustrated in FIG. 1 may also contain a logic circuit 40 that may be implemented locally. Logic circuit 40 may be embedded in comparator 30. Logic circuit 40 may be configured to be connected to the output of comparator 30 so that logic circuit 40 may receive the output from comparator 30. Logic circuit 40 may convert the output of comparator 30 to a digital codeword based on the received signal. Logic circuit 40 may be connected to DAC 20 and may transmit a digital codeword to DAC 20. In an embodiment where comparator 30 is implemented in a flash ADC, logic circuit 40 may be implemented locally in the flash ADC. In an embodiment, logic circuit 40 may be SAR logic. In an alternate embodiment, logic circuit 40 may be another type of logic implemented locally to interpret the comparator output to generate a respective codeword.

The system may also include a DAC 20. DAC 20 may have n-bits of resolution. DAC 20 may be connected to logic circuit 40 and to comparator 30. DAC 20 may be configured to receive a digital codeword from logic circuit 40 and convert the codeword into analog current signals that may be injected into comparator 30. DAC 20 may be connected to comparator 30 at designated points. These points may represent injection points in which DAC 20 injects a calibration current or voltage or voltage into comparator 30. The injection points at which a calibration current or voltage may be injected into comparator 30 may be selected by a designer. In an embodiment, DAC 20 may be connected to comparator 30 at a single injection point. In an alternate embodiment, DAC 20 may be connected to comparator 30 at multiple injection points. In the embodiment illustrated in FIG. 1, DAC 20 may be connected to comparator 30 at two injection points, $ipoint_1$ and $ipoint_2$. In an example embodiment, $ipoint_1$ may be chosen, for example, as a point between a resistor in comparator 30 and the input of the comparator. Alternately, $ipoint_2$ may be selected, for example, as a point between another resistor in comparator 30 and the input of the comparator.

In an example embodiment, DAC 20 may be a low-power DAC. In an embodiment, DAC 20 may be a differential DAC, as illustrated in FIG. 1. In an alternate embodiment, DAC 20 may be a single-ended DAC. In other embodiments, DAC 20 may be a voltage based DAC or a current based DAC.

In an example embodiment, both input terminals of comparator 30 may be connected to the reference signal. In this embodiment, the output of comparator 30 may correlate to the offset voltage of comparator 30. The offset may be received by logic circuit 40 and converted into a digital codeword.

During operation, comparator 30 may be run at a determined clock speed. The input terminals to comparator 30 may be switched so both of the terminals may be connected to the reference signal for a designated number of clock cycles. This may occur by overriding the inputs switches to the comparator to not switch between the input signal and the reference signal, but to continually remain at the reference signal. The switches connecting comparator 30 to the reference signal may be closed and the switches connecting comparator 30 to the input signal may be opened, isolating the comparator from the input. Comparator 30 may compare the reference signal applied to both of the terminals of the comparator and output a signal to logic circuit 40 correlating to the offset of comparator 30. Logic circuit 40 may generate a digital codeword based on the comparator offset and store the codeword.

The digital codeword may be output from logic circuit 40 to DAC 20. DAC 20 may receive the generated digital codeword. The digital codeword may be converted by DAC 20 into a calibration current or voltage or voltage which may be injected into comparator 30. When comparator 30 is run during a sampling phase—where the comparator 30 is connected at one input terminal to the input signal and at the other input terminal to the reference voltage—DAC 20 may inject the calibration current or voltage at the designated injection point(s) of the comparator, ipoint$_1$ and ipoint$_2$ in FIG. 1, effectively correcting the offset of the comparator and connected devices (such as preamplifiers or latch devices).

Figure 2:
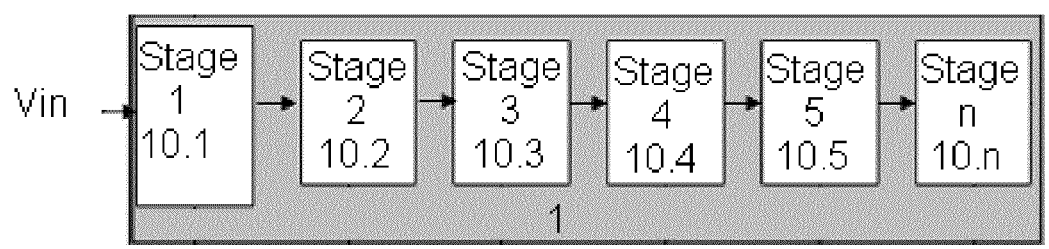
FIG. 2 is a diagram of a pipeline analog to digital converter according to an example embodiment of the present invention.

FIG. 2 illustrates a diagram of a pipeline analog to digital converter according to an embodiment of the present invention. In an embodiment, DAC 20, comparator 30, and logic circuit 40 may be implemented locally in each stage of a pipeline ADC 1. ADC 1 may be a pipeline ADC that contains a number of stages of varying resolution. In an embodiment, ADC 1 may be a multi-bit converter and may not use a sample and hold amplifier ("SHA"). In an embodiment, each of the stages of pipeline ADC 1 may be of the same bit size. In an alternate embodiment, each of the stages may have independent bit sizes that are distinct from the other stages. In an example embodiment, each of the stages may include a flash ADC 10.1-10.n. An input signal, Vin, may be applied to the input of pipeline ADC 1, which may be applied at the first stage of the converter. Each flash ADC 10 may include timing logic to produce necessary sequence information.

The calibration of the offset for each comparator in each of the flash ADC 10.1-10.n may be done simultaneously. Calibration for each comparator may be done by a single calibrate signal, that may be controlled by a master digital component of pipeline ADC 1. When the calibrate signal goes high, both the input terminals of comparator 30 may be switched to the reference signal.

The implementation of the DAC 20 and logic circuit 40 on each flash ADC to calibrate the offset of each individual comparator is advantageous as it allows for a quick and efficient testing and debugging process. Each comparator may also be isolated to determine the effect that the offset from a particular comparator has on the performance of the entire pipeline ADC 1. Additionally, the local implementation of the DAC 20 and the logic circuit 40 may allow for a simplification of the wiring of the back end of the converter to the main digital section of the converter to control the offset calibration of each comparator. A single global signal may be initially be used to begin calibration and negates the need for routing and signaling through the converter to allow for offset cancellation, as there is no need for the stored digital codeword to be accessible by the backend of the converter. If the codeword is desired for testing or debugging purposes, a scan chain functionality may easily be added to logic circuit 40 for this purpose.

Several embodiments of the invention are specifically illustrated and/or described herein. However, it will be appreciated that modifications and variations of the invention are covered by the above teachings and within the purview of the appended claims without departing from the spirit and intended scope of the invention.

What is claimed is:

1. A system for cancelling an offset of a comparator, the system comprising:
    the comparator, wherein all input terminals to the comparator are switchable to a reference signal;
    a logic circuit receiving an output from the comparator and generating a digital codeword locally based on the output from the comparator; and
    a digital to analog converter ("DAC") that receives that digital codeword and injects a calibration current or voltage at designated injection points in the comparator to cancel the offset, wherein the designated injection points are other than the input terminals to the comparator.

2. The system according to claim 1, wherein the logic circuit and the DAC are implemented locally with the comparator.

3. The system according to claim 2, wherein the comparator is implemented in an analog to digital converter ("ADC").

4. The system according to claim 2, wherein the comparator is implemented in a flash analog to digital converter ("ADC").

5. The system according to claim 4, wherein the flash ADC is incorporated in a stage of a pipeline ADC.

6. The system according to claim 1, wherein the logic circuit stores the generated digital codeword.

7. The system according to claim 1, wherein the logic circuit is controlled by a calibration signal.

8. The system according to claim 7, wherein the input terminals to the comparator are switched to the reference signal when the calibration signal goes high.

9. The system according to claim 1, wherein the input terminals to the comparator are switched to the reference signal when input switches are overridden to not switch between an input signal and the reference signal.

10. The system according to claim 1, wherein the logic circuit is successive approximation recursively ("SAR") logic or other type of logic controlling the DAC in a similar manner.

11. The system according to claim 1, wherein the comparator is a single-stage comparator.

12. A method for cancelling an offset of a comparator, the method comprising:
    switching all input terminals to the comparator to a reference signal for a normal clock cycle;
    receiving an output from the comparator by a logic circuit;
    locally generating a digital codeword by the logic circuit based on the output from the comparator;
    storing the digital codeword in the logic circuit;
    transmitting the digital codeword to a digital to analog converter ("DAC"); and
    injecting a calibration current or voltage into the comparator from the DAC at designated injection points to cancel the offset, wherein the designated injection points are other than the input terminals to the comparator.

13. The method according to claim 12, wherein the logic circuit and the DAC are implemented locally with the comparator.

14. The method according to claim 12, wherein the logic circuit is controlled by a calibration signal.

15. The method according to claim 14, wherein the input terminals to the comparator are switched to the reference signal when the calibration signal goes high.

16. The method according to claim 12, wherein the input terminals to the comparator are switched to the reference signal when input switches are overridden to not switch between an input signal and the reference signal.

17. The method according to claim 12, wherein the comparator is implemented in an analog to digital converter ("ADC").

18. The method according to claim 12, wherein the comparator is implemented in a flash analog to digital converter ("ADC").

19. The method according to claim 18, wherein the flash ADC is incorporated in a stage of a pipeline ADC.

20. The system of claim 1, wherein at least one of the designated injection points is connected to one of the input terminals through a resistor.

21. The method of claim 12, wherein at least one of the designated injection points is connected to one of the input terminals through a resistor.

22. The method according to claim 12, wherein the comparator is a single-stage comparator.

* * * * *